United States Patent
Paul et al.

(10) Patent No.: US 7,629,843 B2
(45) Date of Patent: *Dec. 8, 2009

(54) PARALLEL POWER AMPLIFIER AND ASSOCIATED METHODS

(75) Inventors: Susanne A. Paul, Austin, TX (US); Timothy J. Dupuis, Austin, TX (US)

(73) Assignee: Black Sand Technologies, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/536,265

(22) Filed: Sep. 28, 2006

(65) Prior Publication Data

US 2007/0111685 A1    May 17, 2007

Related U.S. Application Data

(63) Continuation of application No. 10/880,964, filed on Jun. 30, 2004, now Pat. No. 7,161,423.

(51) Int. Cl.
*H03F 1/14* (2006.01)

(52) U.S. Cl. .......................................... 330/51; 330/251

(58) Field of Classification Search ............ 330/51, 330/251, 207 A, 302
See application file for complete search history.

(56) References Cited

U.S. PATENT DOCUMENTS

| | | | | |
|---|---|---|---|---|
| 4,994,760 A | * | 2/1991 | Roehrs | 330/295 |
| 6,097,249 A | * | 8/2000 | Strickland et al. | 330/10 |
| 6,137,355 A | * | 10/2000 | Sevic et al. | 330/51 |
| 6,300,829 B1 | * | 10/2001 | Luu | 330/251 |
| 6,605,991 B2 | * | 8/2003 | Midya et al. | 330/10 |
| 6,614,309 B1 | * | 9/2003 | Pehlke | 330/296 |
| 6,788,137 B2 | * | 9/2004 | Morita | 330/10 |
| 6,812,785 B2 | * | 11/2004 | Masuda et al. | 330/10 |
| 7,046,727 B2 | * | 5/2006 | Takagishi | 375/238 |
| 7,312,654 B2 | * | 12/2007 | Roeckner et al. | 330/10 |
| 7,317,413 B2 | * | 1/2008 | Lee | 341/144 |

* cited by examiner

*Primary Examiner*—Henry K Choe
(74) *Attorney, Agent, or Firm*—Johnson & Associates

(57) ABSTRACT

A method and apparatus is provided for use in power amplifiers where multiple parallel power amplifiers provide various output power levels. By selectively enabling and disabling the parallel power amplifiers and combining their outputs, a desired output power can be realized, while choosing a combination of power amplifiers that provide a high efficiency.

20 Claims, 9 Drawing Sheets

PARALLEL POWER AMPLIFIER AND ASSOCIATED METHODS

CROSS REFERENCE TO RELATED APPLICATIONS

This application is a continuation of commonly owned U.S. patent application Ser. No. 10/880,964, filed on Jun. 30, 2004, entitled "PARALLEL POWER AMPLIFIER AND ASSOCIATED METHODS," (U.S. Pat. No. 7,161,423) which is incorporated by reference herein.

FIELD OF THE INVENTION

This invention relates to the field of power amplifiers. In particular, this invention relates to power amplifiers that produce a range of output power levels.

This invention is useful in, for example, mobile telephone systems, and other wireless transmission systems.

BACKGROUND OF THE INVENTION

In some wireless applications, a power amplifier must be able to produce a range of output power levels. For example, in a cellular telephone environment, a base station may dictate the power level at which each cell phone should transmit (based on factors such as the physical distance from the base station, for example). A critical performance metric for power amplifiers in this type of environment relates to efficiency, as defined as the ratio of power delivered to a load to the power drawn by the power amplifier. Most prior art power amplifier architectures are most efficient near their maximum output power levels and their efficiency decreases rapidly as the output power level decreases.

FIG. 1 is a schematic diagram of one example of a prior art power amplifier. FIG. 1 shows a power amplifier 100 including an output stage 102 and a transformation network 104. An RF input signal $R_{fi1}$ is provided to the output stage 102. The output stage 102 includes transistors $M_1$ and $M_2$, which form a push-pull amplifier. The output stage 102 provides a signal at node $v_s$ to the input to the transformation network 104. The transformation network 104 is comprised of a capacitor $C_b$, inductor $L_t$, and capacitor $C_t$, whose values are chosen to produce a desired output impedance at the transmit frequency. The transformation network provides an RF output $v_o$ to a load $R_l$.

In the example shown in FIG. 1, the inductor $L_t$ and capacitor $C_t$ transform the load impedance into a new impedance, $$Z_{in} = \frac{L_t}{C_t R_t}, \quad (1)$$

and the average power delivered to the load is $$P_l = \frac{V_s^2}{Z_{in}}, \quad (2)$$

where $V_s$ represents the root mean square voltage present on node $v_s$. In the example shown in FIG. 1, capacitor $C_b$ is used to isolate the DC level on node $v_t$ from that of node $v_s$, but does not change the transformed impedance significantly.

FIG. 2 is a plot illustrating the efficiency versus the output power of a typical prior art power amplifier, such as the amplifier shown in FIG. 1. As shown, as the output power level decreases, the efficiency also decreases. Since some power amplifiers (such as power amplifiers used in wireless transmission systems) spend a significant portion of time transmitting at low power levels, it is desirable to increase the efficiency at low power levels.

SUMMARY OF THE INVENTION

An RF power amplifier of the present invention includes a first power amplifier slice, the first amplifier slice further comprising an amplifier stage having a plurality of switching devices and an output network having reactive components, a second power amplifier slice, the second amplifier slice further comprising an amplifier stage having a plurality of switching devices and an output network having reactive components, and wherein outputs of the first and second power amplifier slices are combined to provide an output of the RF power amplifier, and wherein the first and second power amplifier slices can be selectively disabled.

In another embodiment, an RF power amplifier for providing power to a load includes a first power amplifier that can be selectively enabled or disabled, wherein the first power amplifier has a first impedance as seen by the load when the first power amplifier is enabled and a second impedance as seen by the load when the first power amplifier is disabled, and a second parallel power amplifier that can be selectively enabled or disabled, wherein the second power amplifier has a third impedance as seen by the load when the second power amplifier is enabled and a fourth impedance as seen by the load when the second power amplifier is disabled, and wherein outputs of the first and second power amplifiers are combined to provide power to the load.

In another embodiment, a method of providing an amplified signal to an output node in an RF power amplifier includes providing a plurality of power amplifiers, each power amplifier having an amplifier stage and a reactive output network, combining outputs of the plurality of power amplifiers to provide an amplified signal to the output node of the RF power amplifier, and selectively disabling one or more of the plurality of power amplifiers based on a desired output power level, wherein each disabled power amplifier is still connected to the output node.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In order to provide a context for understanding this description, the following illustrates a typical application of the present invention. A power amplifier of the present invention may be used as an amplifier for use with a wireless transmission system such as a wireless telephone or other device. The invention may also be applied to other applications, including, but not limited to, RF power amplifiers. In the case of a wireless telephone application, the invention may be applied to GSM, CDMA, PCS, DCS, etc., or other wireless systems.

Figure 3:
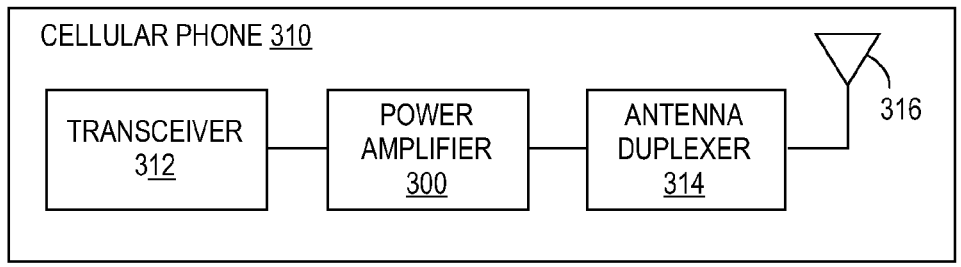
FIG. 3 is a block diagram illustrating a typical application of the present invention.

FIG. 3 is a block diagram illustrating a typical application of the present invention. It should be understood that the present invention can be used in applications and environments other than that shown as an example in the figures. FIG. 3 shows a cellular telephone 310 including a transceiver 312, an antenna duplexer 314, and an antenna 316. Connected between the transceiver 312 and the antenna duplexer 314 is an RF power amplifier 300 for amplifying signals for transmission via the antenna. For clarity, other components of the cellular phone 310 are not shown. In one example, the RF power amplifier 300 may be comprised of a non-linear power amplifier used in communication schemes that utilize frequency shift keying (FSK) or phase shift keying (PSK) such as GSM systems. However, the RF power amplifier 300 may also be used with other communication schemes. When the cellular phone 310 transmits data, the transceiver 312 creates an RF signal which is amplified by the RF power amplifier 300 to a level desired for transmission. The amplified output of the RF power amplifier 300 is provided to the load which is typically a 50 ohm load. The load shown in FIG. 3 is comprised of the antenna duplexer 314 and antenna 316.

Figure 1:
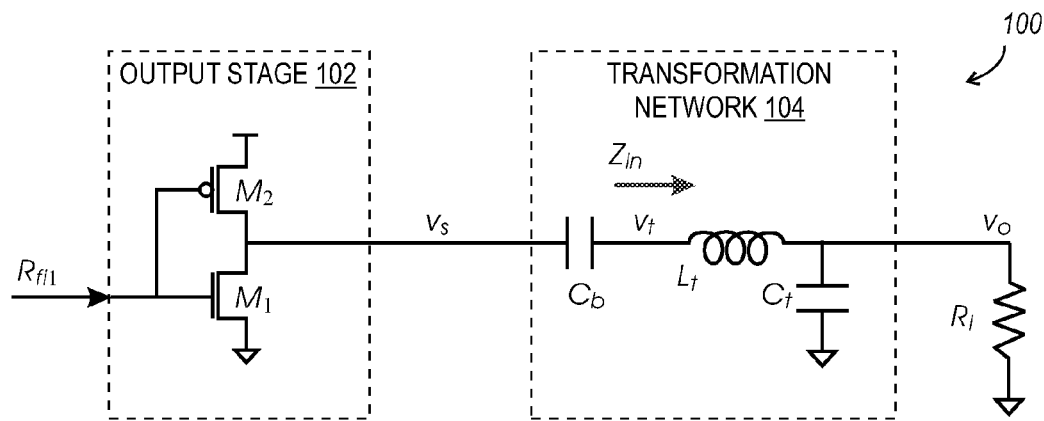
FIG. 1 is a schematic diagram of one example of a prior art power amplifier.

As mentioned above, in some wireless applications, a power amplifier must be able to produce a range of output power levels. One technique for changing the output power level of a power amplifier (such as the power amplifier shown in FIG. 1) is to change the values of the components $L_t$ and $C_t$ to adjust the transformed load impedance according to a desired output power level. The values of the components can be changed using switches that enable or disable inductor and capacitor elements within the transformation network. In theory, this method is capable of high efficiencies at low power, but practical difficulties prevent its use for wireless applications with high output power requirements. First, in these types of applications, the voltages present on nodes $v_t$ and $v_o$ are much larger than most RF capable transistors can support. Second, since large currents flow through the passive elements in the transformation network, switches connected in series with these elements must be able to handle these large currents at RF frequencies with very little power dissipation. Switches that meet these requirements are not readily available. Another technique for controlling the output power level of a power amplifier is described below.

In general, the present invention uses a plurality of parallel power amplifier stages used separately or together to provide different output power levels. By selectively enabling and disabling the parallel power amplifiers and combining their outputs, a desired output power can be realized, while choosing a combination of power amplifiers that provide a desirable efficiency.

Figure 4:
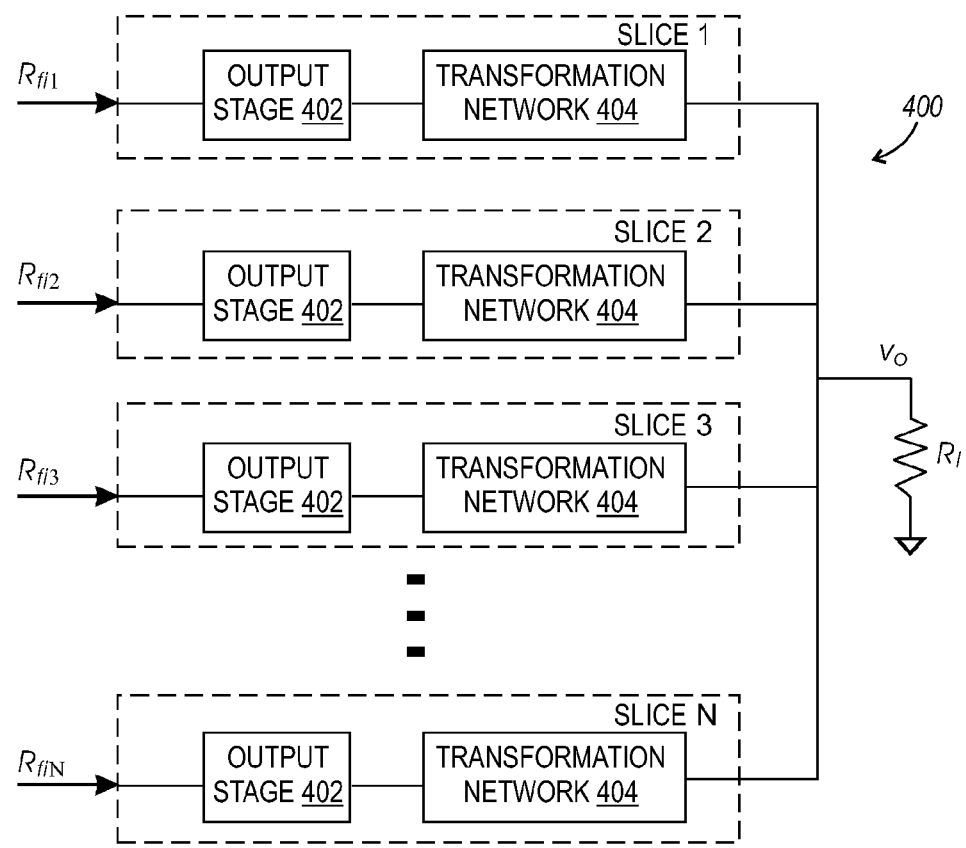
FIG. 4 is a diagram illustrating an example of a power amplifier of the present invention.

FIG. 4 is a diagram illustrating an example of a power amplifier of the present invention. FIG. 4 shows a power amplifier 400 divided into N parallel slices, where each slice has its own power amplifier, including an output stage 402, and its own transformation network 404. For the purposes of this description, the term "slice" is intended to refer to one of the parallel power amplifiers. Each of the slices receives an RF input signal (e.g., $R_{fi1}$, $R_{fi2}$, $R_{fi3}$, ... $R_{fiN}$) and, if enabled, generates an output that is summed at the load with outputs from other enabled slices. Depending on the output power level requirements, any desired combination of slices can be enabled to provide the desired output power level at an optimal efficiency.

Figure 2:
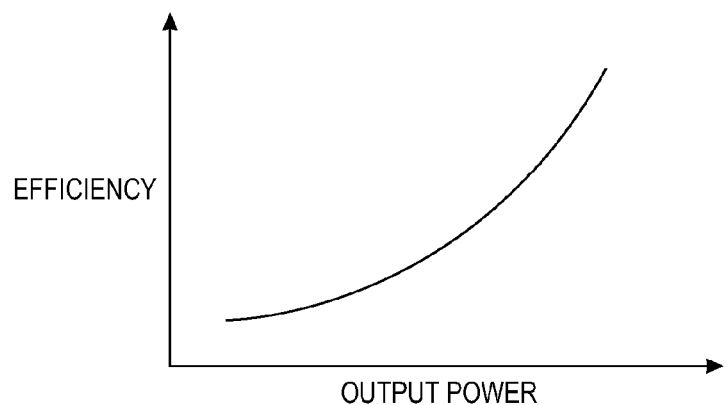
FIG. 2 is a plot illustrating the efficiency versus the output power of a typical prior art power amplifier, such as the amplifier shown in FIG. 1.
Figure 5:
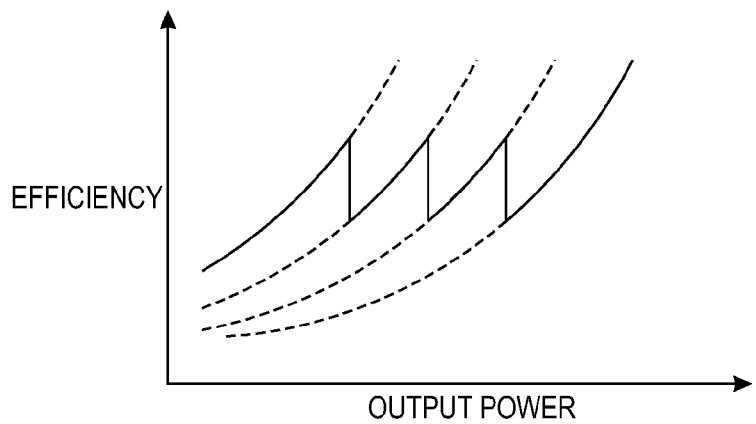
FIG. 5 is a plot illustrating the efficiency versus the output power of a power amplifier of the present invention.

FIG. 5 is a plot illustrating the efficiency versus the output power of a power amplifier of the present invention. FIG. 5 shows four separate efficiency curves (dashed lines) resulting from different slices or combinations of slices. Of course, more or less efficiency curves may be possible depending on the specific implementation used. In the example shown in FIG. 5, the solid line shows the effective efficiency curve that is achieved by selectively enabling and disabling the slices of the power amplifier. As shown, the efficiency of a power amplifier of the present invention remains relatively high over a much larger output power range than does a power amplifier of the prior art (see FIG. 2). As is described in detail below, there are numerous possible implementations possible of the present invention.

Figure 6:
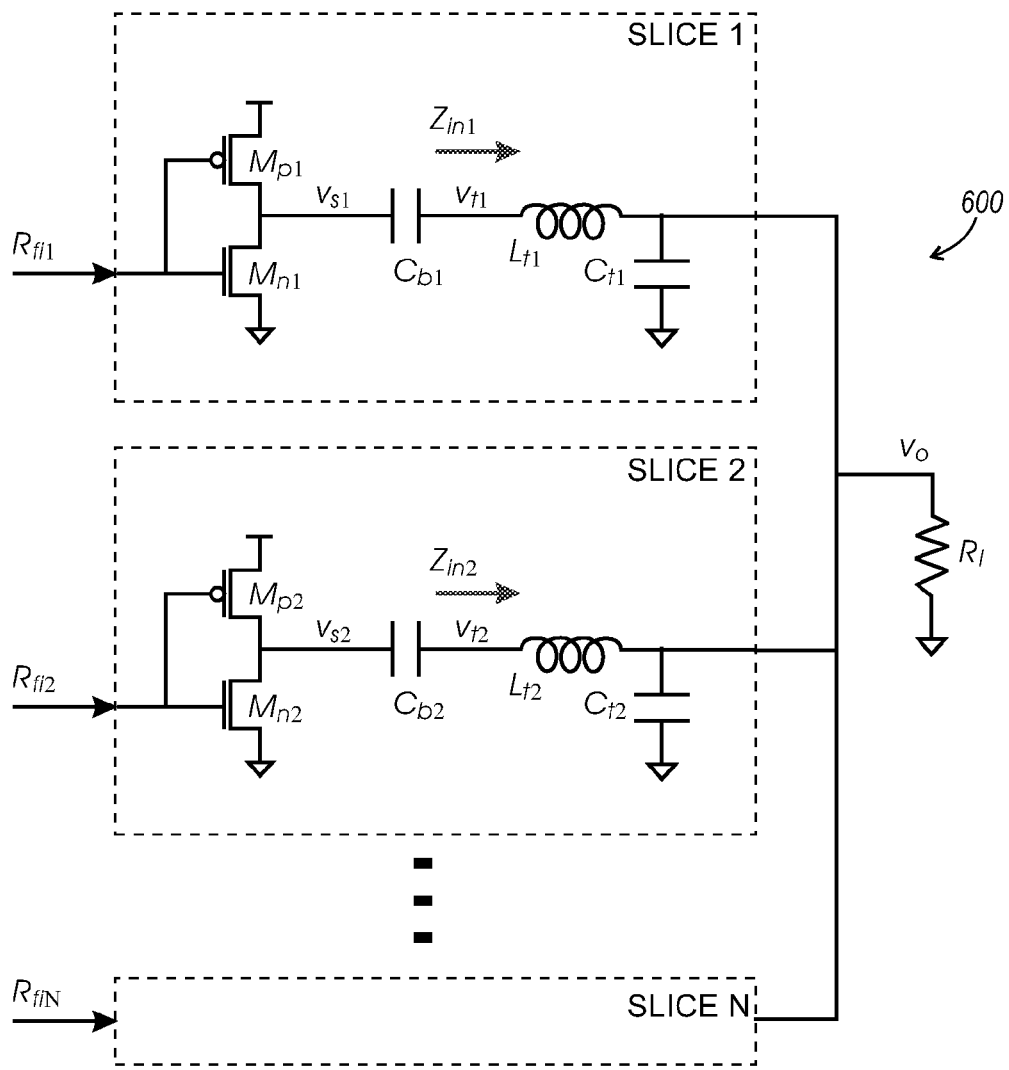
FIG. 6 is a schematic diagram of one embodiment of the present invention.

FIG. 6 is a schematic diagram of one embodiment of the present invention. FIG. 6 shows a multi-slice amplifier 600 having N slices, where each slice is designed to provide the same output power as the single-slice amplifier shown in FIG. 1. Each slice shown in FIG. 6 includes an output stage and a transformation network, similar to those described above with respect to FIG. 1. For clarity, the circuitry of slice N is not shown, although, in this example, it is the same as in slices 1 and 2. The output stage of each slice is comprised of switching devices Mp1 and Mn1 (e.g., transistors), connected in a pull-pull configuration. The transformation network of each stage is comprised of a capacitor $C_b$, inductor $L_t$, and capacitor $C_t$. The transformation network provides an RF output $v_o$ to a load $R_l$. In this example, the transformation network in each slice is designed so that the transformed impedance ($Z_{in1}$, $Z_{in2}$, $Z_{in3}$, ... $Z_{inN}$) seen by each slice equals that of the single-slice amplifier, $Z_{in}$, multiplied by the total number of slices, N. One way to accomplish this is to multiply the inductances $L_t$ by N and to divide the capacitances $C_t$ by N so that the resonant frequency of the circuit is unchanged. The resulting transformed impedance is illustrated in the following equation, $$Z_{in1} = \frac{(NL_t)}{\left(\dfrac{C_t}{N}\right)(NR_l)} = NZ_{in}. \qquad (3)$$

The average power delivered to the load from all N slices is $$P_l = N \frac{V_s^2}{(NZ_{in})} = \frac{V_s^2}{Z_{in}}, \quad (4)$$

where $V_s$ represents the root mean square voltage present on each of the nodes $v_{s1}$ through $v_{sN}$.

At full power, all of the slices of the power amplifier 600 can be enabled so that the outputs of each slice are combined and provided to the load. The power amplifier 600 can be operated at a reduced power level by disabling one or more of the slices. A slice can be disabled by driving its $R_{fi}$ input with a dc signal. For example, consider a two-slice power amplifier. Slice 2 can be disabled by driving $R_{fi2}$ to a high dc voltage so that switching device $M_{n2}$ is continuously on and switching device $M_{p2}$ is continuously off. Slice 1 is enabled by driving its input with an RF signal.

Figure 7:
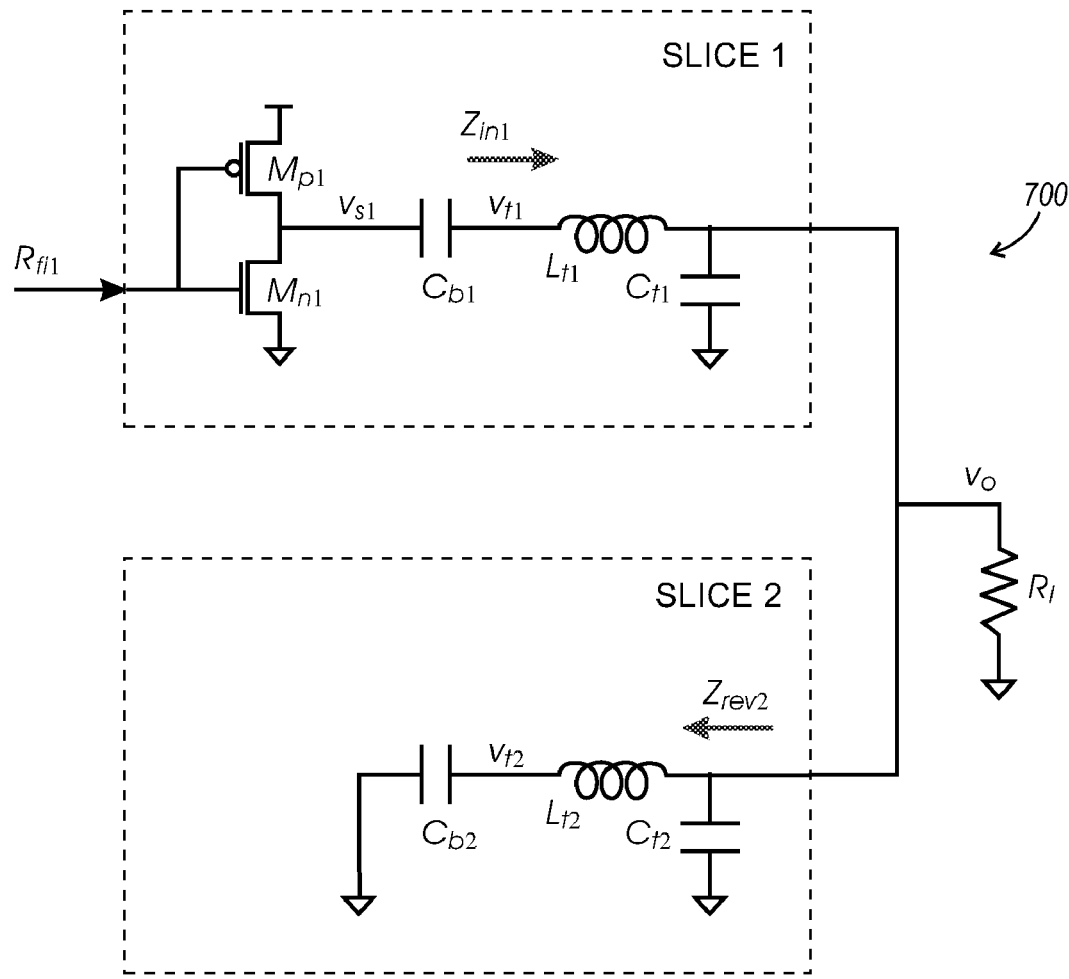
FIG. 7 is a schematic diagram illustrating a two-slice power amplifier with one slice disabled.

FIG. 7 is a schematic diagram illustrating a two-slice power amplifier 700 with slice 2 disabled. The output stage of slice 2 is still there, but is not shown for purposes of clarity, since switching devices $M_{n2}$ and $M_{p2}$ no longer effect the performance of the circuit. If switching device $M_{p2}$ is turned off and $M_{n2}$ is turned on, capacitor $C_{b2}$ is effectively connected to ground, as shown. The output stage in slice 1 sees a modified load impedance as shown in FIG. 7. The values of the components in the transformation networks of slices 1 and 2 can be chosen so that the load impedance $Z_{in1}$ produces a desired output power. For example, if the values of $L_t$ and $C_t$ are chosen to resonate at the desired transmit frequency, and capacitor $C_b$ is very large, then the impedance $Z_{rev2}$ looking back into slice 2 is very large. The resulting transformed impedance is illustrated by the following equation, $$Z_{in1} = \frac{(NL_t)}{\left(\frac{C_t}{N}\right)(R_l)} = N^2 Z_{in}. \quad (5)$$

The power delivered to the load in this example equals $$P_l = \frac{V_s^2}{N^2 Z_{in}}, \quad (6)$$

where $V_s$ represents the root mean square voltage present on node $v_{s1}$ in slice 1.

The approach described above is capable of high efficiency at low power levels. First, at lower output power levels, the switching devices $M_n$ and $M_p$ in slices that are disabled are not being switched. This results in less power being dissipated in the source-drain paths, eliminates the need to charge and discharge capacitances on the drain nodes, and eliminates dissipation due to resistance in parasitic paths. Second, there is little power dissipation in predriver circuits (not shown) for the slices that are disabled, since they are driven by dc rather than RF signals.

The example above describes a 2-slice configuration in which both slices have the same component values and the output power produced with one slice disabled is one quarter of the power produced with both slices enabled. In general, different slices can be sized differently and other high-power and low-power combinations can be achieved by proper choice of the component values in each slice.

Figure 8:
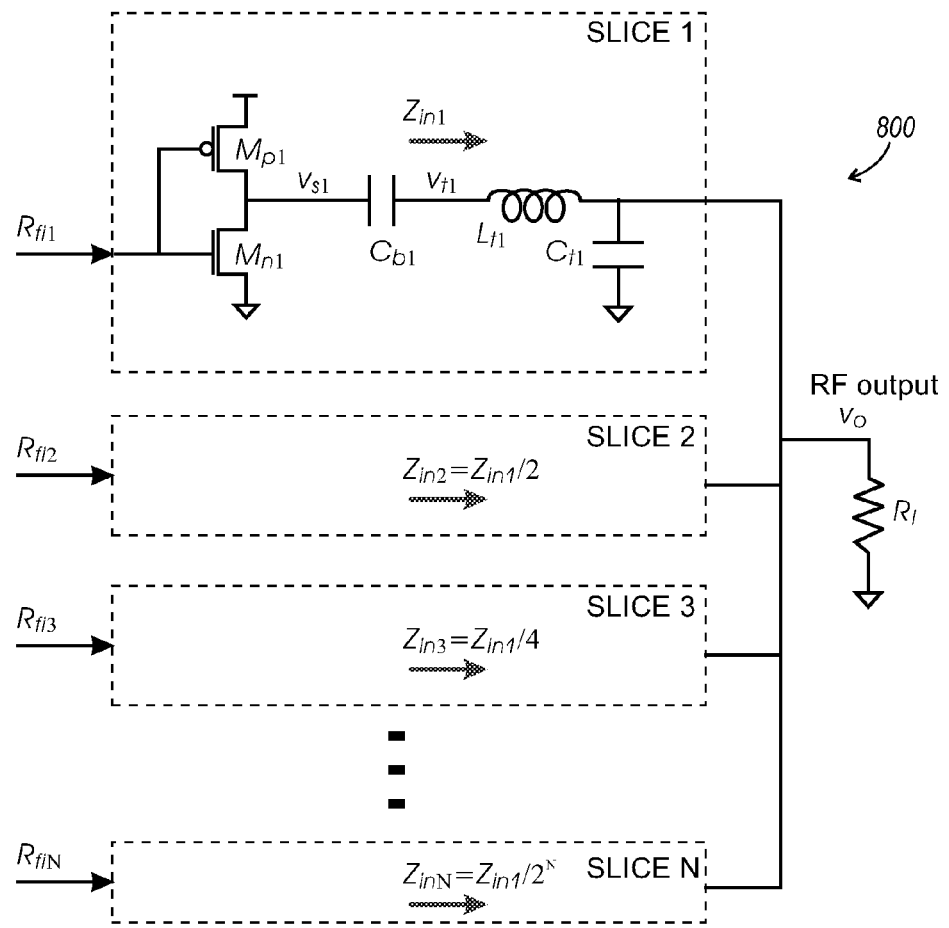
FIG. 8 is a schematic diagram of a power amplifier with N unequally sized slices.

FIG. 8 is a schematic diagram of a power amplifier 800 with N unequally sized slices. Like the examples described above, each slice of the power amplifier 800 includes an output stage and a transformation network. One example of the use of a power amplifier, such as power amplifier 800, with unequally sized slices is an amplifier whose output power is controlled digitally from 0 to $P_{max}$. Slice 1 of the power amplifier 800 is designed to output a power level of $P_{max}/2$. Slice 2 is designed to output a power level of $P_{max}/4$. Slice N is designed to output a power level of $P_{max}2^{-N}$. Combinations of slices 1 through N can then be selectively enabled and disabled to produce any one of $2^N$ output power levels ranging from 0 to $P_{max}(1-2^{-N})$ The transformed impedances ($Z_{in1}, Z_{in2}, Z_{in3}, \ldots Z_{inN}$) of each slice of the power amplifier 800 are illustrated in FIG. 8.

There are numerous ways of disabling a slice of a power amplifier of the present invention. In the examples described above (see FIG. 7), the input to a slice was set to a dc level to a disabled the slice. The dc level is set so that the node $v_s$ is clamped to ground. However, other methods can also be used for disabling a slice. FIGS. 9A through 10B show examples of two techniques for disabling a power amplifier slice, as well as the effective circuit of a disabled slice.

Figure 9A:
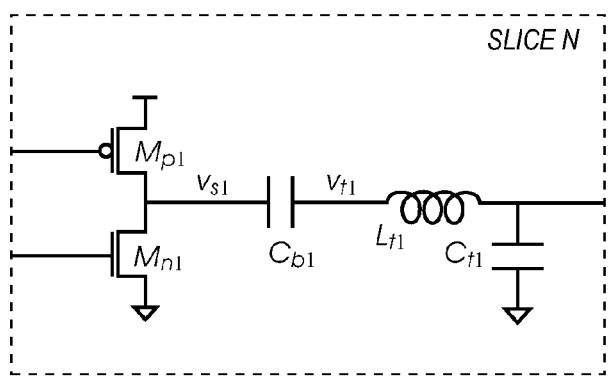
FIGS. 9A through 10B show examples of two techniques for disabling a power amplifier slice.
Figure 9B:
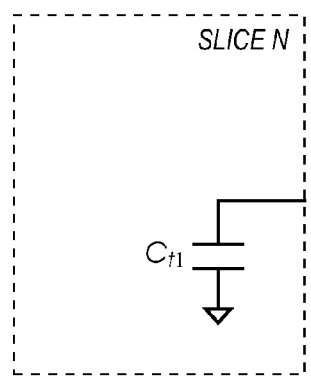

FIG. 9A shows a power amplifier slice similar to the power amplifier slices shown described above. The slice shown in FIG. 9A can disabled by setting the gate of switching device $M_{n1}$ to ground and the gate of $M_{p1}$ to a high voltage so that both switching devices are turned off, leaving node $v_{s1}$ floating. FIG. 9B shows the effective circuit seen looking back into this slice from the output of the slice. As shown, the effective circuit when the slice is disabled is capacitor $C_{t1}$ connected between the output node and ground.

Figure 10A:
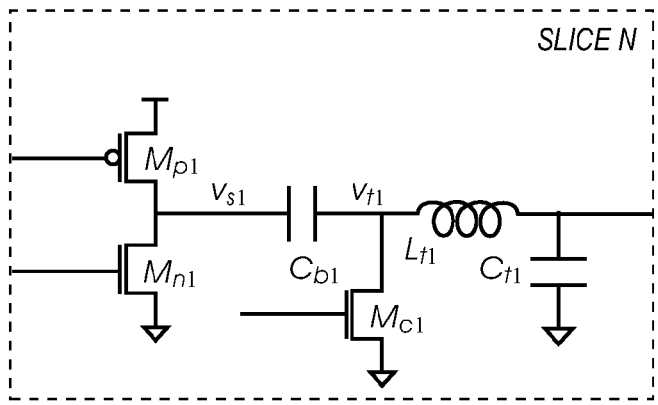
Figure 10B:
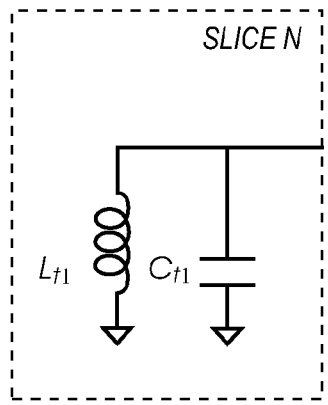

FIG. 10A also shows a power amplifier slice similar to the power amplifier slices described above. The slice shown in FIG. 10A can disabled by setting the gate of switching device $M_{n1}$ to ground and the gate of $M_{p1}$ to a high voltage so that both switching devices are turned off, leaving node $v_{s1}$ floating. In addition, a clamp device $M_{c1}$, connected between node $v_{t1}$ and a bias voltage, is turned on. In the example of FIG. 10A, the bias voltage is ground. Another example of a bias voltage could be a positive or negative voltage source, such as a supply voltage, etc. FIG. 10B shows the effective circuit seen looking back into this slice from the output of the slice. As shown, the effective circuit when the slice is disabled is capacitor $C_{t1}$ and inductor $L_{t1}$ connected in parallel between the output node and ground. Note that the examples described above provide a technique for disabling a slice without the requirement of switch connected in series between the transformation network and the load. Also note that in the examples described above, the impedance as seen by the load of a disabled slice is not infinite (i.e., an open circuit), but is dependent on components in the transformation network. Of course, in other embodiments, a switching device may be used to disconnect a disabled slice from the load.

Each of the power amplifier slices described above has a transformation network that consists of an inductor and a capacitor (inductor $L_{t1}$ and capacitor $C_{t1}$ in the examples shown). The purpose of the transformation networks is to perform impedance transformation or impedance matching and to combine the output power from multiple slices so that the power may be delivered to a single load. These functions can be accomplished using a variety of circuits, in addition to the examples described above, comprised of reactive elements such as inductors, capacitors, baluns, mutually-coupled inductors, etc.

Figure 11:
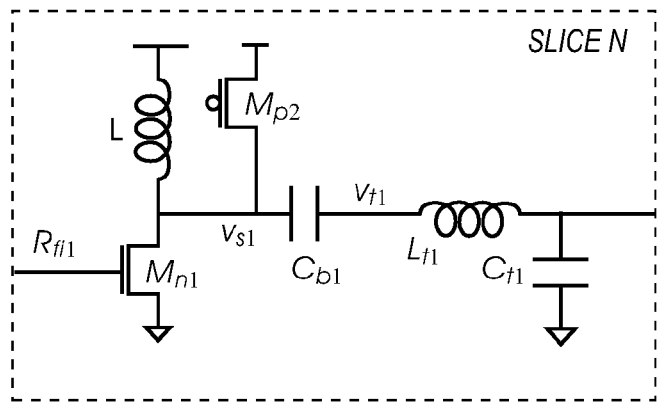
FIG. 11 shows an example of one slice of a multi-slice power amplifier using a Class A amplifier stage.

Each power amplifier slice in the examples described above includes a PMOS and an NMOS transistor whose purpose is to amplify the power of an RF input signal and transfer this power to the transformation network or power combiner. This function can be accomplished using any desired RF power amplifier configuration. FIG. 11 shows an example of one slice of a multi-slice power amplifier using a Class A amplifier stage. In the example shown in FIG. 11, switching device $M_{p2}$ is turned off when the slice is enabled and the circuit operates as a Class A amplifier. When the slice is disabled, the input signal $R_{fi1}$ is set to ground so that switching device $M_{n1}$ is off and switching device $M_{p2}$ is turned on to clamp node $v_{s1}$ to the positive power supply. It can be seen that any suitable power amplifier design can be used with the present invention.

Figure 12A:
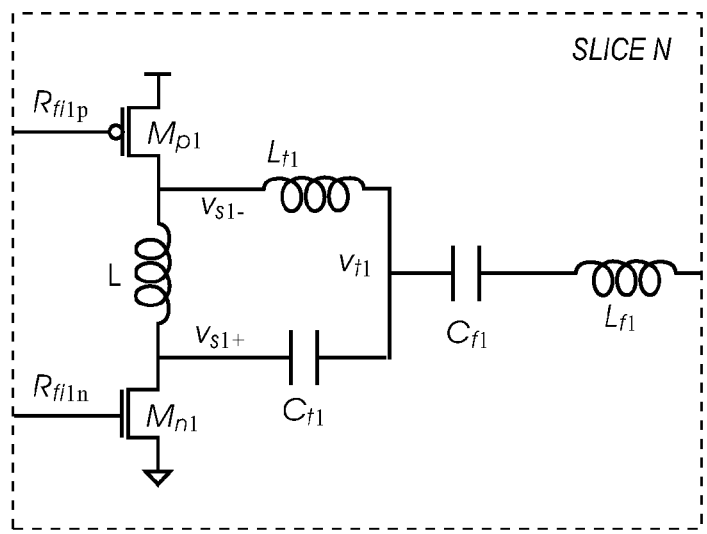
FIGS. 12A and 12B illustrate another embodiment of one slice of a multi-slice power amplifier.
Figure 12B:
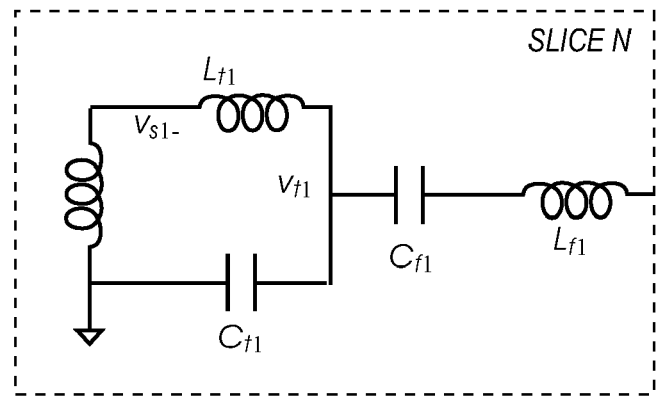

FIGS. 12A and 12B illustrate another embodiment of one slice of a multi-slice power amplifier. FIG. 12A shows a power amplifier slice with an RF input provided by the differential voltage ($R_{fip}$–$R_{fin}$). The output stage of the slice is comprised of an inductor L connected between a first switching device $M_{p1}$ and a second switching device $M_{n1}$. The output stage provides a differential output voltage ($v_{s1}$–$v_{s1\_}$) to the transformation network. The transformation network, which is formed from inductor $L_{t1}$ and capacitor $C_{t1}$, transforms the output impedance and performs filtering. Capacitor $C_{f1}$ and inductor $L_{f1}$ perform filtering and provides isolation of the dc levels between node $v_{t1}$ and the output of the slice. In one embodiment, all or part of inductor $L_{f1}$ may be formed from parasitic wiring inductance that is present when outputs from the multiple power amplifier slices are joined together.

The power amplifier slice shown in FIG. 12A can be disabled, for example, by either supplying a high dc voltage on both of the input signals, $R_{fi1p}$ and $R_{fi1n}$, or by supplying a low dc voltage on both of these signals. In the case of a high dc input on both of the input signals, $R_{fi1p}$ and $R_{fi1n}$, the switching device $M_{n1}$ is continuously on and the switching device $M_{p1}$ is continuously off so that the node $v_{s1+}$ is clamped to ground and the node $v_{s1\_}$ is not driven. FIG. 12B shows the equivalent circuit for the power amplifier slice of FIG. 12A, when the slice is disabled by supplying a high dc voltage on both of the input signals, $R_{fi1p}$ and $R_{fi1n}$.

Figure 13A:
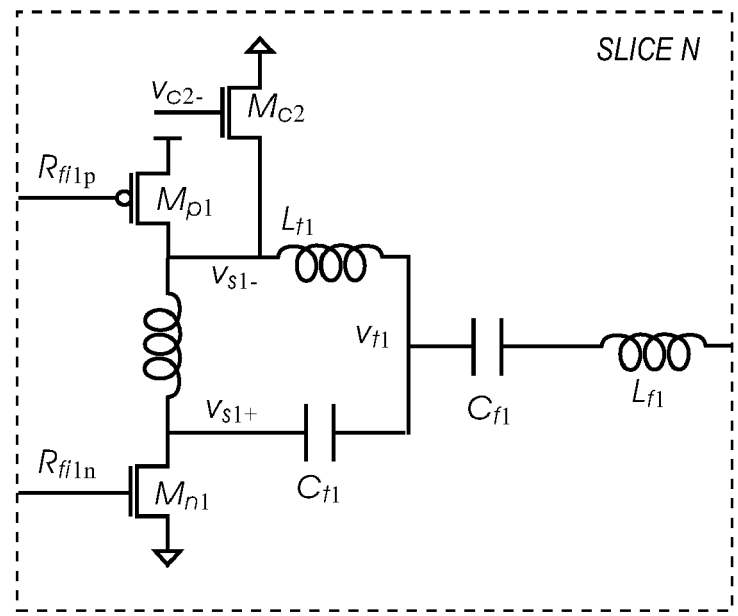
FIGS. 13A and 13B illustrate another example of how the power amplifier slice shown in FIG. 12A may be disabled.
Figure 13B:
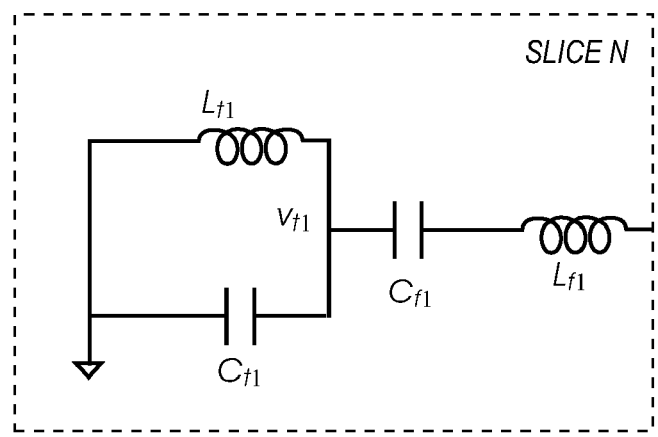

Methods, other than those described above, may also be used for disabling the power amplifier slice shown in FIG. 12A. FIGS. 13A and 13B illustrate another example of how a power amplifier slice shown in FIG. 12A may be disabled. The power amplifier slice shown in FIG. 13A includes an additional clamp $M_{c2}$ which is added to clamp node $v_{s1\_}$ to ground when the slice is disabled. To disable the slice, a high voltage is provided to node $v_{c2\_}$ which turns on clamp $M_{c2}$, while supplying a high dc voltage on both of the input signals, $R_{fi1p}$ and $R_{fi1n}$, as described above. FIG. 13B shows the equivalent circuit for the power amplifier slice of FIG. 13A, when the slice is disabled. The configuration shown in FIGS. 13A and 13B has the advantage that, for typical choices of component values, the equivalent circuit presents a high reverse impedance and will not load down the outputs of other enabled power amplifier slices.

Figure 14:
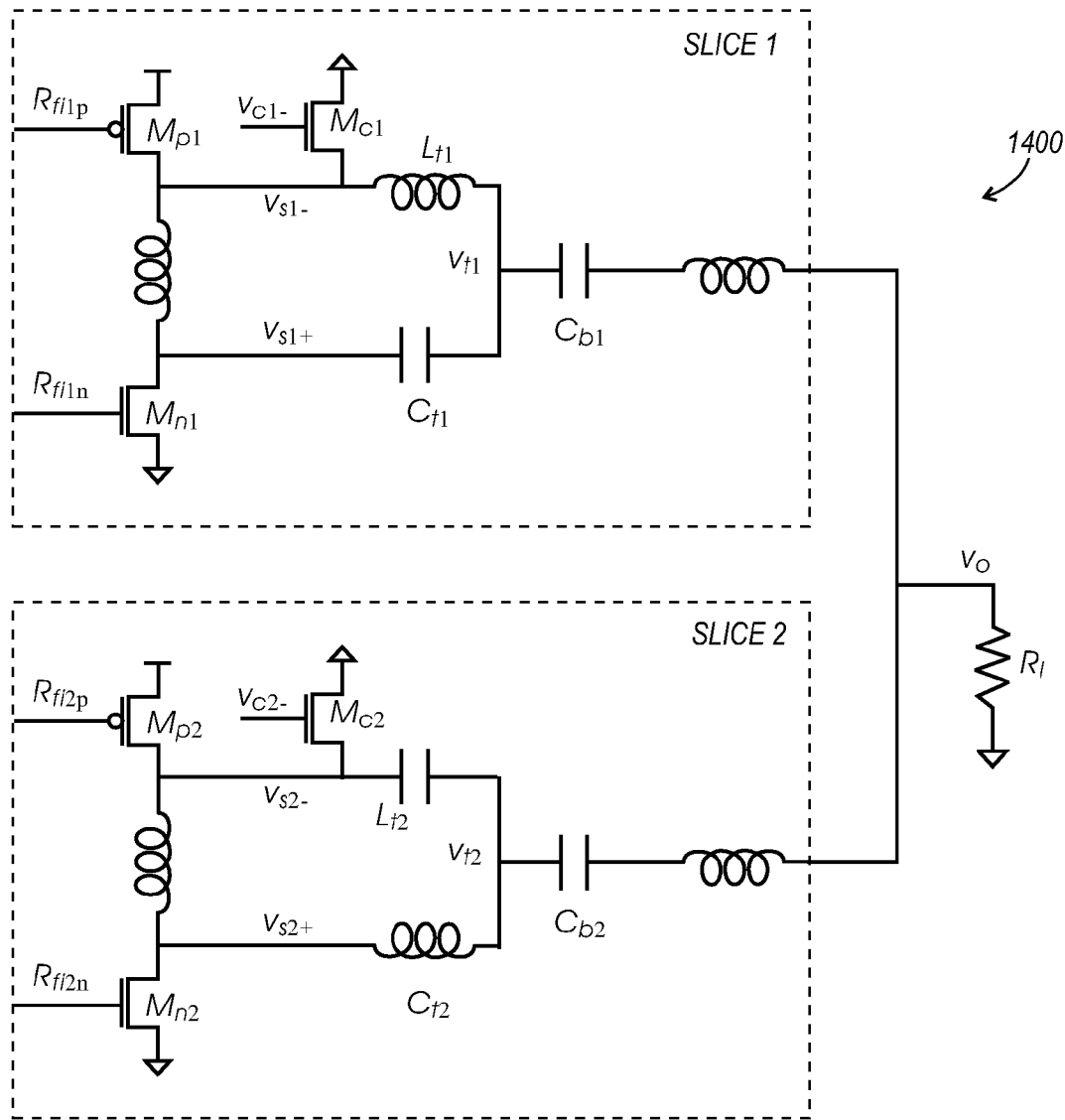
FIG. 14 shows another embodiment of a 2-slice power amplifier.

As mentioned above, different power amplifier slices can be sized the same or differently, depending on the preferences of the designer. In one example of a multi-slice power amplifier, all of the power amplifier slices contain identical circuits. However, in general, the power amplifier slices may differ from one another not only in component values, but also in topology. FIG. 14 shows another embodiment of a 2-slice power amplifier. The power amplifier 1400 in FIG. 14 provides an example where the topologies of the 2 slices are different. When both power amplifier slices are enabled, the differential inputs ($R_{fip}$ and $R_{fin}$) to each of the two slices are opposite in sign. The transformation networks of the first and second slices are flipped so that their output powers sum in phase at the load. Slice 1 can be disabled by driving both of its inputs to a high dc voltage so that switch $M_{n1}$ is on, and by driving the signal $v_{c1\_}$ to a high voltage so that switch $M_{c1}$ is also on (see FIGS. 13A and 13B). If each slice has its own power supply, then an additional step may be desirable when disabling one of the slices. In addition to turning on the two clamp devices, the positive voltage supply to the slice can be disabled so that its supply voltage is reduced to zero. Slice 2 can be disabled in similar ways to those described for slice 1.

As described above, enabling and disabling different combinations of power amplifier slices of a multi-slice power amplifier results in discrete output power levels. However, applications where the power amplifier is ramped up and down in a bursted fashion may require a method for controlling the output power in an analog fashion. A variety of methods of analog power control are well known for single-slice power amplifiers. These methods include adjusting the bias voltage of the slice inputs, adjusting the positive supply voltage provided to the slice, etc. These same methods can be applied to a multi-slice power amplifier as well.

In one embodiment of the invention, the output power of an RF power amplifier can be controlled digitally. In this example, a constant supply voltage VDD is provided to each of a plurality of amplifier slices. To control the output power level, one or more of a plurality of slices are selectively activated via control signals. Since the supply voltage does not require an analog input, the power control is all digital. Of course, if a digitally controlled voltage regulator is implemented, then the supply voltage level could also be digitally controlled.

Figure 15:
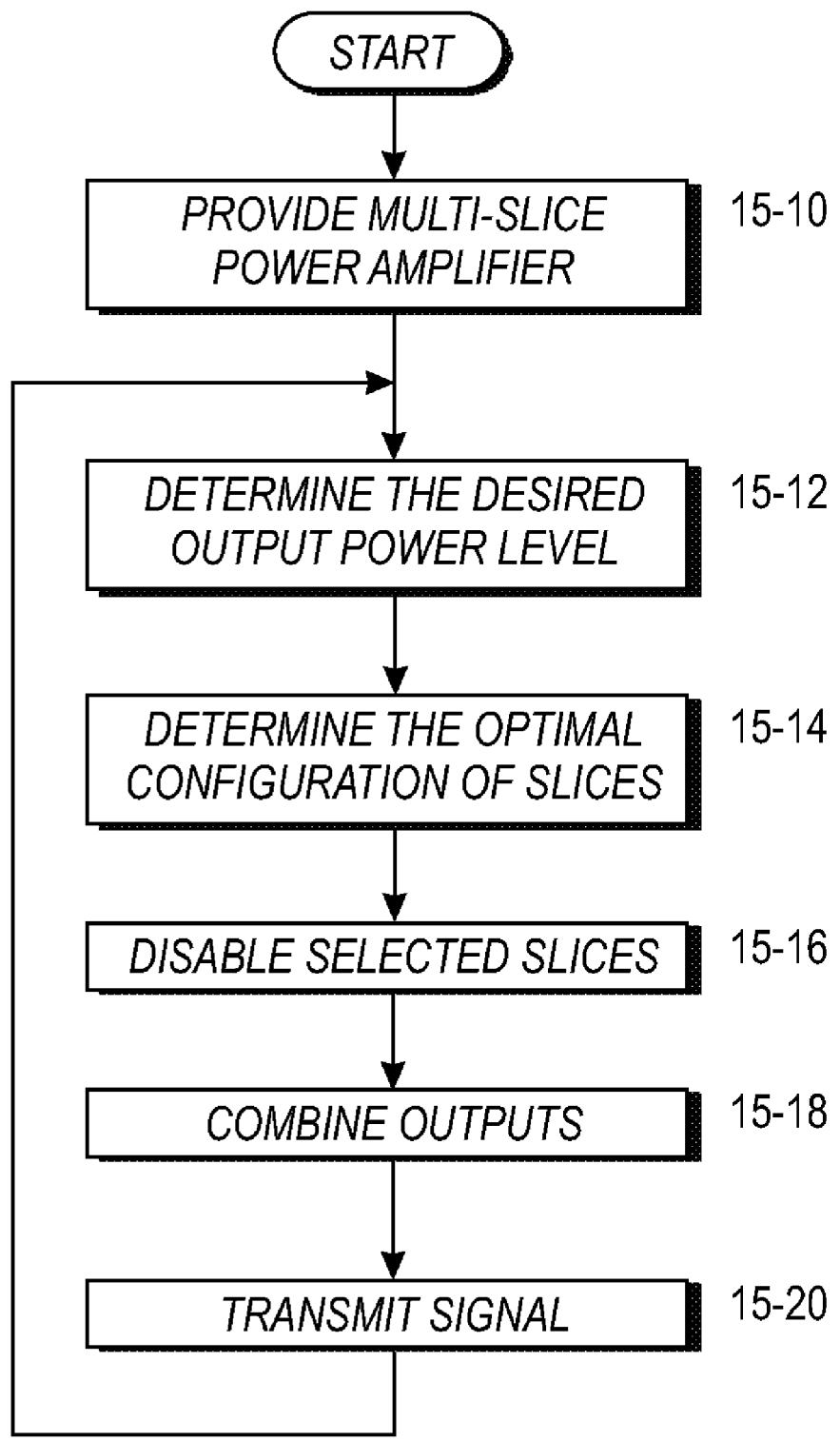
FIG. 15 is a flow chart illustrating an example of the operation of the present invention.

Following is a description of the operation of the present invention, in the context of a multi-slice power amplifier used on a wireless communications network. FIG. 15 is a flow chart illustrating an example of the operation of the present invention. The process illustrated in FIG. 15 begins at step 15-10, where a multi-slice power amplifier is provided. Any suitable multi-slice power amplifier (such as those described above) may be used. Next, at step 15-12, the process determines what output power is desired. This determination can be made in a number of ways, but in one example, the desired output power can be determined, at least in part, based on the distance between the power amplifier and a cellular tower. Once the desired output power is determined, the process proceeds to step 15-14, where an optimal configuration of power amplifier slices is determined. As described above, the power amplifier slices can be selectively disabled to obtain the desired output level at the optimal efficiency. In one embodiment, a look-up table containing efficiency data (such as the data illustrated in the efficiency plot of FIG. 5) can be consulted to choose the optimal configuration based on the desired output power level. Next, at step 15-16, selected power amplifier slices are disabled based on the optimal configuration determined in step 15-14. For example, at one extreme, if the desired output power level is very low, perhaps only one slice will be enabled. In contrast, for a maximum output power level, perhaps all of the slices will be enabled. The total number of possible combinations will depend on the number of slices. Also note that other techniques (described above) can also be used to effect the output power level. At step 15-18, the outputs of the slices are combined. In the examples described above, the outputs of the slices are always combined since they are each connected to the load. Next, at step 15-20, the RF output signal is transmitted, and the process returns to step 15-12. Note however, that step 15-20 will continue (in this example) throughout the entire signal burst. In other words, the output power level is not constantly adjusted during a single burst. The process ends when the signal transmission is over. Note that the process described above is merely one example of the operation of the present invention.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A cellular telephone comprising:
    an antenna for transmitting and receiving RF signals;
    a transceiver coupled to the antenna for generating signals to be transmitted by the antenna; and
    an RF power amplifier coupled between the antenna and the transceiver, the RF power amplifier further comprising,
        a first power amplifier that can be selectively enabled and disabled, the first power amplifier having a first transformation network that produces a desired impedance at a load, the first transformation network including an inductor and a capacitor,
        a second parallel power amplifier that can be selectively enabled and disabled, the second power amplifier having a second transformation network that produces a desired impedance at the load, the second transformation network including an inductor and a capacitor, and
        wherein outputs of the first and second power amplifiers are combined to provide an amplified RF signal to the antenna.

2. The cellular telephone of claim 1, wherein the outputs of the first and second power amplifiers are each coupled to an output of the RF power amplifier while the amplifiers are disabled.

3. The cellular telephone of claim 1, wherein the RF power amplifier further comprises a third power amplifier that can be selectively enabled and disabled, and wherein the outputs of the first, second, and third power amplifiers are combined to provide the amplified RF signal to the antenna.

4. The cellular telephone of claim 1, wherein the first power amplifier is disabled by coupling a dc signal to an input of the first power amplifier.

5. The cellular telephone of claim 4, wherein the second power amplifier is disabled by coupling a dc signal to an input of the second power amplifier.

6. The cellular telephone of claim 1, wherein each of the first and second power amplifiers can be disabled without the use of a switch coupled in series between an output network and a load.

7. The cellular telephone of claim 1, wherein the first and second power amplifiers each have a first impedance as seen by a load while they are enabled, and a second impedance as seen by the load when they are disabled.

8. The cellular telephone of claim 7, wherein the value of the second impedance is dependent on the reactive components of an output network of the respective disabled power amplifier.

9. The cellular telephone of claim 1, wherein the first and second power amplifiers each include a switching device for disabling the respective power amplifier.

10. The cellular telephone of claim 1, wherein the first and second power amplifiers each have two inputs for receiving differential input signals.

11. The cellular telephone of claim 1, wherein each of the first and second amplifiers further comprises:
    an inductor;
    a first switching device coupled between the inductor and a first bias voltage; and
    a second switching device coupled between the inductor and a second bias voltage.

12. An RF power amplifier comprising:
    a first power amplifier, the first power amplifier having a first transformation network that produces a desired impedance at a load, the first transformation network including an inductor and a capacitor;
    a second power amplifier configured parallel to the first power amplifier, the second power amplifier having a second transformation network that produces a desired impedance at the load, the second transformation network including an inductor and a capacitor;
    a third power amplifier configured parallel to the first and second power amplifiers, the third power amplifier having a third transformation network that produces a desired impedance at the load, the third transformation network including an inductor and a capacitor; and
    wherein outputs of the first, second, and third power amplifiers are combined to provide an output of the RF power amplifier, and wherein the first, second, and third power amplifiers can be selectively disabled.

13. The RF power amplifier of claim 12, wherein the outputs of the first, second, and third power amplifiers are each coupled to the output of the RF power amplifier while the each respective power amplifier is disabled.

14. The RF power amplifier of claim 12, wherein the first, second, and third power amplifiers are disabled by coupling a dc signal to an input of the power amplifier to be disabled.

15. The RF power amplifier of claim 12, wherein each of the first, second, and third power amplifiers can be disabled without the use of a switch coupled in series between an output network and a load.

16. The RF power amplifier of claim 12, wherein the first, second, and third power amplifiers each have a first impedance as seen by a load while they are enabled, and a second impedance as seen by the load when they are disabled.

17. The RF power amplifier of claim 16, wherein the value of the second impedance is dependent on the reactive components of an output network of the disabled power amplifier.

18. The RF power amplifier of claim 12, wherein each of the first, second, and third power amplifiers have the same topology.

19. The RE power amplifier of claim 12, wherein each of the first, second, and third power amplifiers have different topologies.

20. The RE power amplifier of claim 12, wherein each of the first, second, and third power amplifiers includes a switching device for disabling the respective power amplifier.

* * * * *